US012635473B2

(12) United States Patent
Wei et al.

(10) Patent No.: US 12,635,473 B2
(45) Date of Patent: May 19, 2026

(54) FLAT BOTTOM SHADOW RING

(71) Applicant: Lam Research Corporation, Fremont, CA (US)

(72) Inventors: Lai Wei, Fremont, CA (US); Ji Soo Kim, Pleasanton, CA (US); Alan Jeffrey Miller, Moraga, CA (US); William Thie, Fremont, CA (US); Frank Yun Lin, Fremont, CA (US); Jun Hee Hee Han, San Ramon, CA (US); Jie Liu, Union City, CA (US); Conan Chiang, Cupertino, CA (US); Michael John Martin, Union City, CA (US)

(73) Assignee: Lam Research Corporation, Fremont, CA (US)

( * ) Notice: Subject to any disclaimer, the term of this patent is extended or adjusted under 35 U.S.C. 154(b) by 570 days.

(21) Appl. No.: 18/009,254

(22) PCT Filed: Jun. 10, 2021

(86) PCT No.: PCT/US2021/036802
§ 371 (c)(1),
(2) Date: Dec. 8, 2022

(87) PCT Pub. No.: WO2021/252758
PCT Pub. Date: Dec. 16, 2021

(65) Prior Publication Data
US 2023/0223292 A1     Jul. 13, 2023

Related U.S. Application Data

(60) Provisional application No. 63/038,026, filed on Jun. 11, 2020.

(51) Int. Cl.
*H01J 37/32*     (2006.01)
*H10P 50/24*     (2026.01)
(Continued)

(52) U.S. Cl.
CPC .... *H10P 72/7606* (2026.01); *H01J 37/32642* (2013.01); *H01J 37/32715* (2013.01);
(Continued)

(58) Field of Classification Search
None
See application file for complete search history.

(56) References Cited

U.S. PATENT DOCUMENTS 5,476,548 A * 12/1995 Lei ...................... C23C 16/4585
                                                                118/503
5,800,686 A * 9/1998 Littau ............... H01L 21/68721
                                                                118/725
(Continued)

FOREIGN PATENT DOCUMENTS

CN       115943486       4/2023
JP       2015050156       3/2015
(Continued)

OTHER PUBLICATIONS

"Japanese Application Serial No. 2022-574725, Notification of Reasons for Refusal mailed Jan. 14, 2025", w English translation, 8 pgs.
(Continued)

*Primary Examiner* — Binu Thomas
(74) *Attorney, Agent, or Firm* — Schwegman Lundberg & Woessner, P.A.

(57) ABSTRACT

In some examples, a flat Bottom Shadow Ring (fBSR) is provided for processing a substrate in a processing chamber. An example fBSR comprises an overhang for covering an edge of the substrate in the processing chamber. The overhang includes a fiat zone that extends radially outward over the outer edge of the substrate.

6 Claims, 8 Drawing Sheets

(51) Int. Cl.

| | | |
|---|---|---|
| *H10P 72/00* | (2026.01) | |
| *H10P 72/76* | (2026.01) | |

(52) U.S. Cl.

CPC ........ *H10P 50/242* (2026.01); *H10P 72/0421* (2026.01); *H10P 72/7611* (2026.01); *H01J 2237/334* (2013.01)

(56) References Cited

U.S. PATENT DOCUMENTS

| | | | |
|---|---|---|---|
| 2003/0217693 A1* | 11/2003 | Rattner | ............. H01L 21/68721 118/500 |
| 2005/0196971 A1 | 9/2005 | Sen et al. | |
| 2008/0242117 A1 | 10/2008 | Ramanarayanan et al. | |
| 2010/0144160 A1 | 6/2010 | White et al. | |
| 2011/0024041 A1 | 2/2011 | Komuro | |
| 2014/0235063 A1* | 8/2014 | McMillin | .......... H01J 37/32642 156/345.3 |

FOREIGN PATENT DOCUMENTS

| | | |
|---|---|---|
| JP | 2023529651 | 7/2023 |
| JP | 7741824 B2 | 9/2025 |
| KR | 20140103872 | 8/2014 |
| KR | 20140119004 | 10/2014 |
| TW | 201937591 | 9/2019 |
| WO | WO-2021252758 A1 | 12/2021 |

OTHER PUBLICATIONS

"Korean Application Serial No. 10-2023-7000616, Notice of Preliminary Rejection mailed Feb. 10, 2025", w English Translation, 15 pgs.

"Taiwanese Application Serial No. 110121127, Office Action mailed Mar. 28, 2025", W English Translation, 21 pgs.

"Korean Application Serial No. 10-2023-7000616, Response filed Apr. 10, 2025 to Notice of Preliminary Rejection mailed Feb. 10, 2025", W English Claims, 35 pgs.

"Japanese Application Serial No. 2022-574725, Response filed Apr. 14, 2025 to Notification of Reasons for Refusal mailed Jan. 14, 2025", w English claims, 7 pgs.

"International Application Serial No. PCT US2021 036802, International Preliminary Report on Patentability mailed Dec. 22, 2022", 6 pgs.

International Application Serial No. PCT/US2021/036802, International Search Report mailed Sep. 30, 2021, 3 pgs.

International Application Serial No. PCT/US2021/036802, Written Opinion mailed Sep. 30, 2021, 4 pgs.

Korean Application Serial No. 10-2023-7000616, Notice of Preliminary Rejection mailed Oct. 29, 2025, w/ English machine translation, 5 pgs.

Singapore Application Serial No. 11202260935R, Written Opinion mailed Sep. 2, 2025, 8 pgs.

Taiwanese Application Serial No. 110121127, Response filed Jun. 25, 2025 to Office Action mailed Mar. 28, 2025, With English Translation of Claims, 15 pgs.

"Korean Application Serial No. 10-2023-7000616, Response filed Jan. 29, 2026 to Notice of Preliminary Rejection mailed Oct. 29, 2025", W English Claims, 24 pgs.

* cited by examiner

700

702

SUPPORT THE SUBSTRATE ON A SUBSTRATE-SUPPORT ASSEMBLY WITHIN THE PROCESSING CHAMBER

704

INSTALL fBSR

706

COVER AN EDGE OF THE SUBSTRATE WITH THE OVERHANG OF THE fBSR

708

PROCESS THE SUBSTRATE

FLAT BOTTOM SHADOW RING

CLAIM OF PRIORITY

This application is a U.S. National Stage Filing under 35 U.S.C. 371 from International Application No. PCT/US2021/036802, filed on Jun. 10, 2021, and published as WO 2021/252758 A1 on Dec. 16, 2021, which claims the benefit of priority to U.S. Provisional Patent Application No. 63/038,026, filed on Jun. 11, 2020, each of which is incorporated by reference herein in its entirety.

FIELD

The present disclosure relates generally to semiconductor manufacturing, and more particularly to a flat Bottom Shadow Ring for substrate etching operations.

BACKGROUND

Undesired black silicon formation can present a significant defect issue in deep silicon etch operations. Such formation may sometimes occur in wafer bevel zones at the outer edges of a wafer. Black silicon may be observed for example in silicon needles which trap light and cause plasma or RF shadows. Black silicon and defective formations may be prone to breakage. This breakage can cause major defect issues in production.

A known technique to address black silicon formation has included, for example, covering the edge of the to protect it from etching. Some edge covering techniques employ a Bottom Shadow Ring (BSR). Even with a BSR, with increasing profile depths it can nevertheless remain challenging to deliver uniform radial gradients or depth uniformity, particularly in narrow edge exclusion zones of a wafer. Indeed, in some instances, inherent characteristics of some currently available BSRs can exacerbate these problems.

For example, a known type of BSR 302 is illustrated in FIG. 3. This type of BSR. 302 has a short lip 306 having a radial length in the range of 0.254 to 7.6 mm (approximately 0.01 to 0.3 inches). It will be seen that a radially inner zone 303 of the BSR 302 includes a ramp 304. The ramp 304 presents an obstruction that can cause etching and other processing issues. For example, the reflective shape of the ramp 304 can interfere with RF fields and cause shadows, "no etch" zones, and possible misalignment of structures, vias, and so forth.

The background description provided here is to generally present the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

BRIEF SUMMARY

In some examples, a flat Bottom Shadow Ring (fBSR) for processing a substrate in a processing chamber is provided. An example fBSR comprises an overhang for covering an edge of the substrate in the processing chamber. The overhang includes a flat zone, the flat zone extends radially outward over an outer edge of the substrate. In some examples, the flat zone is generally parallel with an upper surface of the substrate.

In some examples, a method of processing a substrate in a processing chamber is provided. An example method comprises supporting the substrate on a substrate-support assembly within the processing chamber. The method includes installing an fBSR in the processing chamber, wherein the fBSR comprises an overhang for covering an edge of the substrate in the processing chamber, and wherein the overhang includes a flat zone extending radially outward over an outer edge of the substrate. The method further includes centering the fBSR over the substrate and covering the edge of the substrate with the overhang of the fBSR, and then processing the substrate in the processing chamber.

BRIEF DESCRIPTION OF THE DRAWINGS

Some embodiments are illustrated by way of example and not limitation in the views of the accompanying drawings. To more easily identify the discussion of any particular element or act, the most significant digit or digits in a reference number refer to the figure number in which that element is first introduced.

DETAILED DESCRIPTION

The description that follows includes systems, methods, and techniques which embody illustrative embodiments of the present disclosure. In the following description, for purposes of explanation, numerous specific details are outlined to provide a thorough understanding of example embodiments. It will be evident, however, to one skilled in the art that the present disclosure may be practiced without these specific details.

Figure 1:
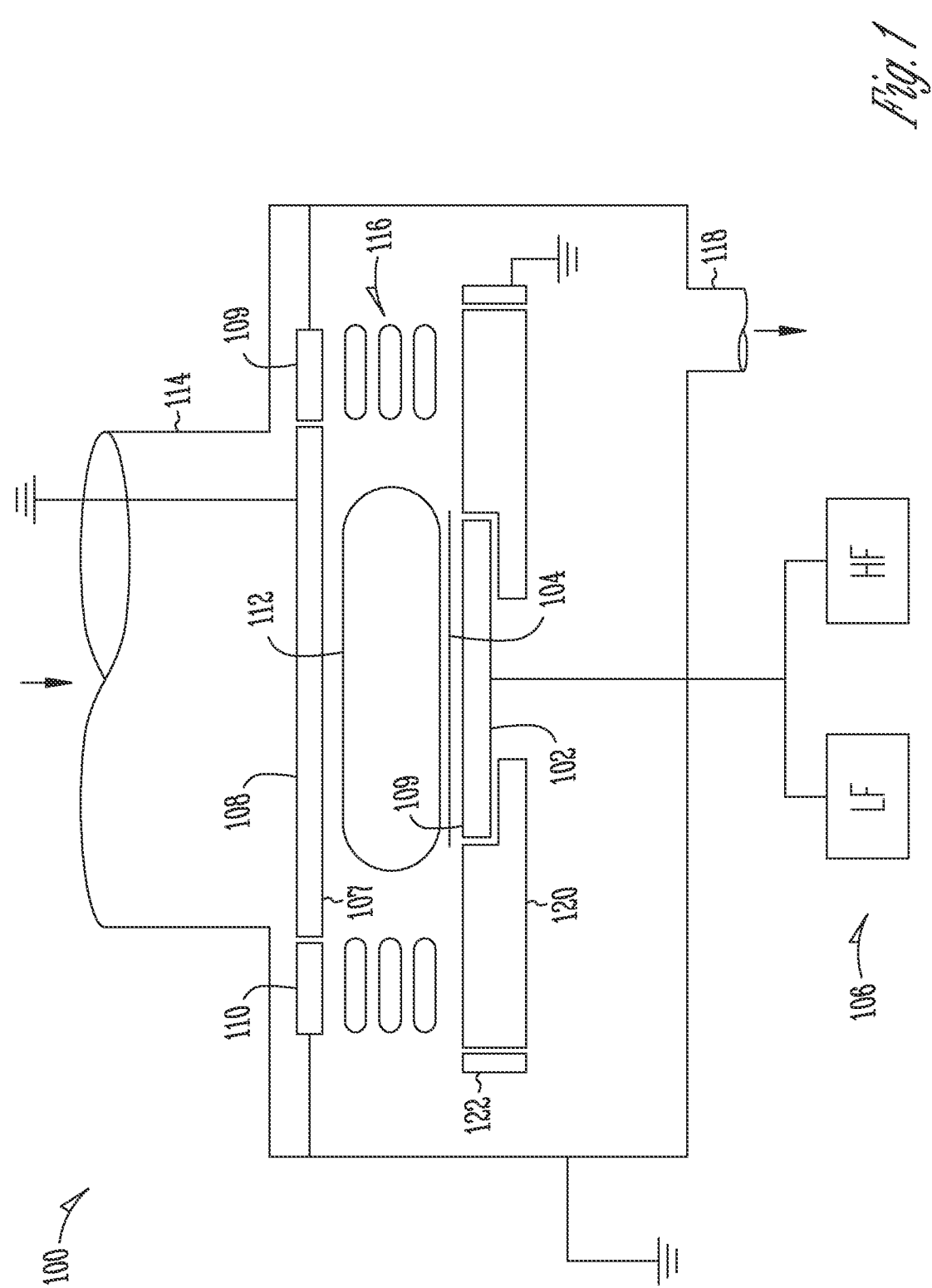
FIG. 1 is a schematic diagram of a reaction chamber within which some embodiments of the present flat BSR may be employed.

FIG. 1 is a schematic diagram of a reaction chamber within which some embodiments of the present flat BSR may be employed. FIG. 1 illustrates a capacitively-coupled plasma processing chamber 100, representing an exemplary plasma processing chamber of the type typically employed to etch a substrate. The processing chamber 100 includes a substrate-support assembly such as a chuck 102, representing the workpiece holder on which a substrate, such as a wafer 104, is positioned during etching. The chuck 102 may be implemented by any suitable chucking technique, for example, electrostatic, mechanical, clamping, vacuum, or the like. During etching, the chuck 102 is typically supplied with dual RF frequencies (a low frequency and high frequency), for example, 2 MHz and 27 MHz, simultaneously, during etching by a dual-frequency power source 106.

An upper electrode 108 is located above the wafer 104. The upper electrode 108 is grounded. FIG. 1 illustrates an etching reactor in which the bottom surface 107 of the upper electrode 108 is larger than the top surface 109 of the chuck 102 and the wafer 104. During etching, plasma 112 is formed from etchant source gas supplied via a mixed gas line 114 and pumped out through an exhaust line 118. Within the processing chamber 100, the mixed gas line 114 may be connected to a showerhead (not shown) The upstream mixing and distribution of gases outside the processing chamber 100 is discussed in more detail below.

An electrical insulator ring 110 insulates the upper electrode 108 from the processing chamber 100. Confinement rings 116 may be placed between the upper electrode 108 and a bottom electrode, such as the chuck 102. In general, confinement rings 116 help confine the etching plasma 112 to the region above the wafer 104 to improve process control and to ensure repeatability.

When RF power is supplied to chuck 102 from the dual-frequency power source 106, equipotential field lines are set up over wafer 104. The equipotential field lines are the electric field lines across the plasma sheath that is between wafer 104 and the plasma 112. Crossing these equipotential field lines are electric field lines in the plasma sheath that is between wafer 104 and the plasma 112. During plasma processing, the positive ions accelerate across the equipotential field lines to impinge on the surface of wafer 104, thereby providing the desired etch effect, such as improving etch directionality. Due to the geometry of the upper electrode 108 and the chuck 102, the field lines may not be uniform across the wafer surface and may vary significantly at the edge of the wafer 104. Accordingly, a focus ring 120 is typically provided to improve process uniformity across the entire wafer surface. With reference to FIG. 1, wafer 104 is shown disposed within a focus ring 120, which may be formed of a suitable dielectric material such as ceramic, quartz, plastic, or the like. Thus, the presence of the focus ring 120 allows the equipotential field lines to be disposed substantially uniformly over the entire surface of the wafer 104.

An electrically conductive shield 122 substantially encircles the focus ring 120, The electrically conductive shield 122 is configured to be substantially grounded within the processing chamber 100. The conductive shield 122 prevents the presence of unwanted equipotential field lines outside of focus ring 120. In relation to the chamber source gas supplied via the mixed gas line 114, it has been found that the gas transport characteristics within the plasma reactor and upstream of it can be the most sensitive variables contributing to etch or deposition non-uniformities.

In some embodiments, a gas delivery panel upstream of the mixed gas line 114 is supplied by the individual, gas-specific supply lines before mixing. These lines can include piping and flow components such as valves, regulators, mass flow controllers (MFCs), and so forth for each gas constituent in a gas mixture. These individual lines supply gas to a conventional gas mixing manifold via manifold inlets. The individual gases are mixed in the manifold before leaving the manifold via an exit to be distributed to other components or a processing chamber (for example, the processing chamber 100, FIG. 1) via a gas supply line (for example, a mixed gas line 114, FIG. 1).

In some embodiments, a gas mixing manifold or distributor includes an elongate, tubular structure of the relatively high volume. Each gas supply line for creating the desired gas mixture is spaced a certain distance along the length of the gas manifold. Some manifolds may be up to 27 inches in length, for example. The overall length of a given manifold may be based on the number of gas lines supplying it. The number of gas lines may in turn be dependent on the gas mixture desired for a given process in a processing chamber 100.

Figure 2:
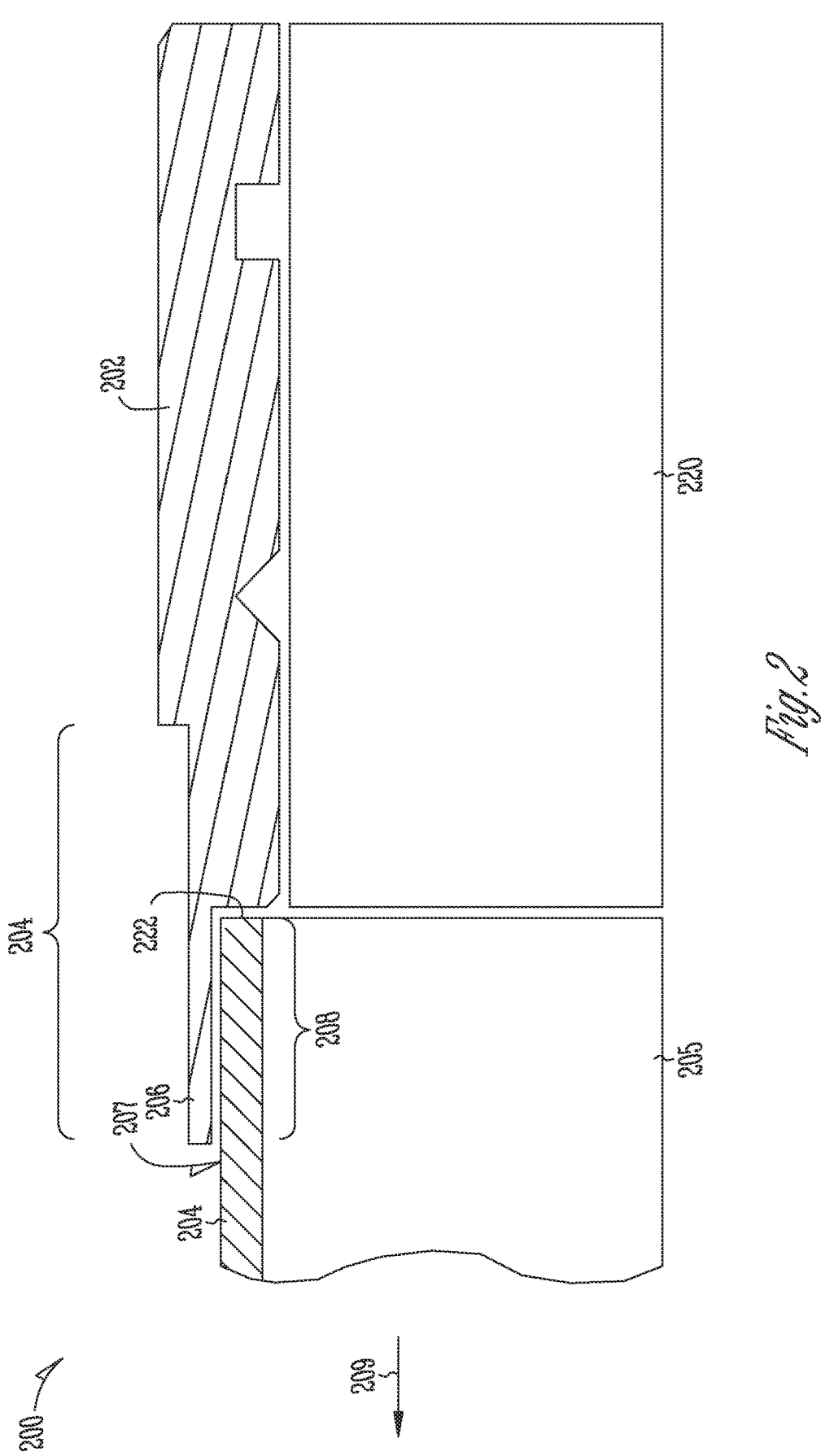
FIG. 2 illustrates a general arrangement of an fBSR in accordance with one embodiment.

FIG. 2 illustrates a general arrangement 200 of an fBSR 202 in accordance with an example embodiment. In this embodiment, the arrangement 200 includes a wafer 204 and a chuck 205. The wafer includes an upper surface 207. One or more confinement or focus rings 220 surround the wafer 204. The respective centers of the wafer 204 and the chuck 205 are to the left in direction 209 in the view. In some instances, an fBSR 202 may be deployed in such a way that an overhang 206 of the fBSR 202 covers an edge region 208 of the wafer 204 and extends over an outer edge 222 of the wafer 204.

Figure 3:
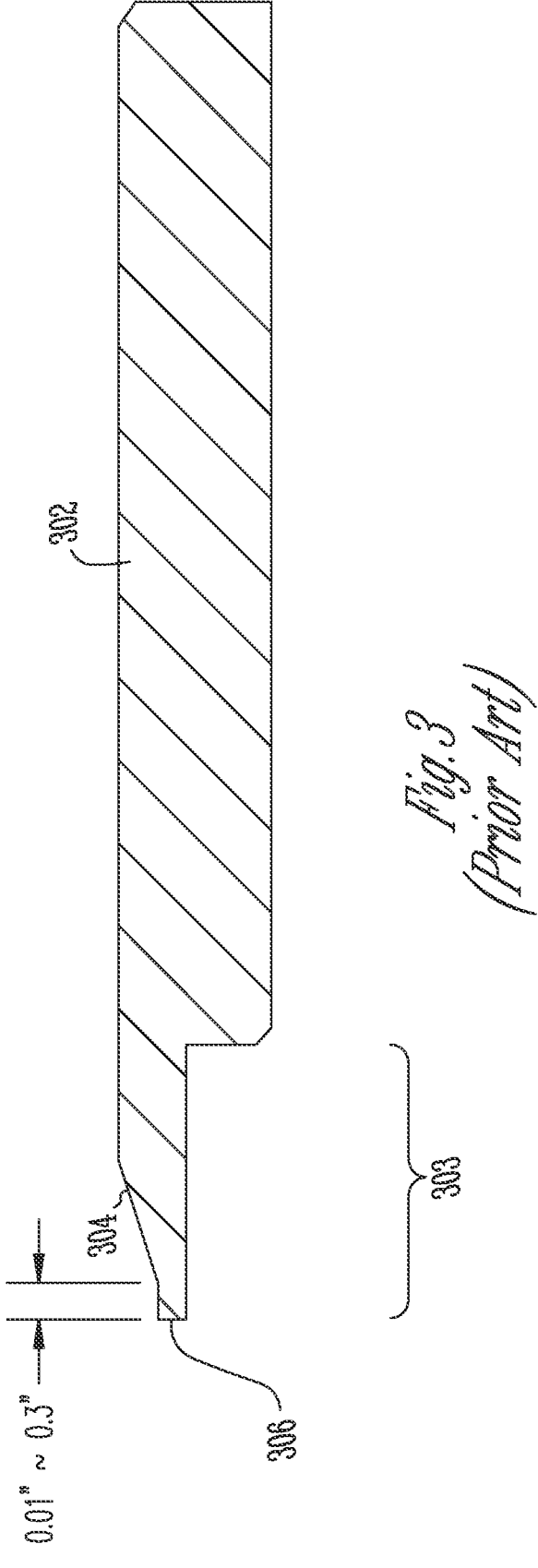
FIG. 3 illustrates one type of known BSR in accordance with one example.
Figure 4A:
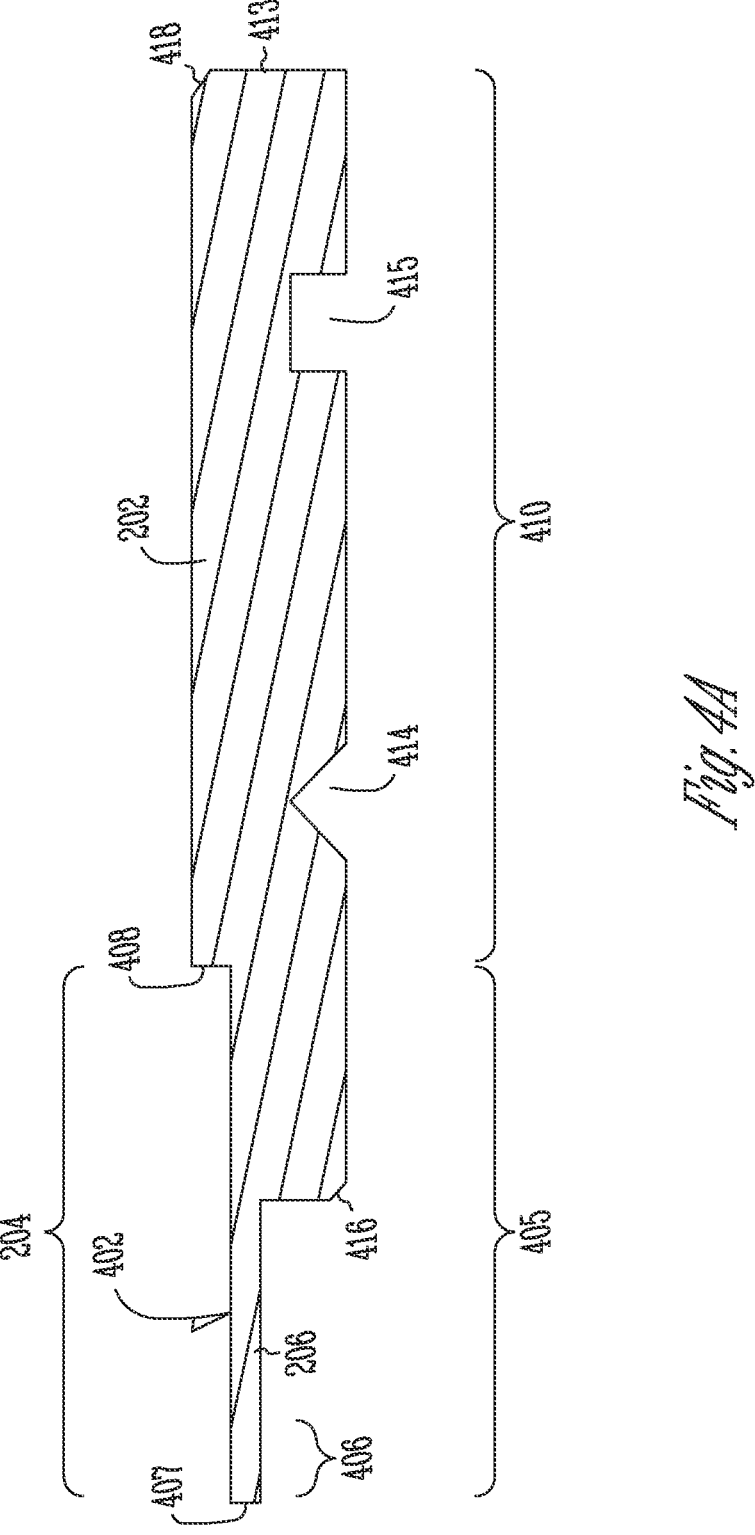
FIG. 4A is an enlarged view of the fBSR 202 shown in FIG. 2.

FIG. 4A is an enlarged view of the fBSR 202 shown in FIG. 2. The fBSR 202 of FIG. 4A includes an extended flat zone 204 disposed along an upper surface 402 of the fBSR 202. In some embodiments, the flat zone 204 is disposed inside a radially inner zone 405 of the fBSR 202. In contrast to the known BSR 302 (FIG. 3), the flat zone 204 is devoid of an obstructing profile or interfering structure, A ramp 304, as is present on the BSR 302, is not present in the fBSR 202. The issues discussed above in relation to the interfering nature of the ramp 304 are thereby mitigated, or at least reduced. With reference again to FIG. 2, in some examples, the flat zone 204 lies in a flat, un-inclined plane which is parallel to the plane of the upper surface 207 of the wafer 204.

In some examples, the fBSR 402 includes a thin overhang 206 having an appreciably longer radial length than the short lip 306 of BSR 302 (FIG. 3). In some examples, the thin overhang 206 has a radial area or dimension greater than the radial area of short lip 306 of the BSR 302. In some embodiments, the thin overhang 206 extends partway along and defines a portion of the flat zone 204. In some examples, the thin overhang 206 has a radial length in the range of 7.62 to 76.2 mm (approximately 0.3 to 3.0 inches).

According to certain embodiments, the thin overhang 206 has a nose section 406, which is shorter than the length of the thin overhang 206, for covering or overlapping a selected, corresponding edge region of a wafer 204 (FIG. 2), in some examples, the nose section 406 has a radial length in the range of 0.245 to 7.62 mm (approximately 0.01 to 0.3 inches). In some examples, a distance between an inner edge 407 of the fBSR 402 and a center of the processed wafer is in the range of 381 to 152.4 mm (approximately 1.5 to 6.0 inches), based on a wafer diameter of 76.2 to 304.8 mm (approximately 3.0 to 12.0 inches).

In some examples, the fBSR 202 has a uniform sectional thickness in the region of the thin overhang 206. In certain embodiments, the fBSR 202 has a sectional thickness of the thin overhang 206 and/or nose section 406 in the range of 0.245 to 7.6 mm (approximately 0.01 to 0.3 inches) for retrofitting certain process chambers. In some examples, the thin overhang 206 forms part of or defines, a portion or all of the upper, extended flat zone 204, as shown. In some examples, the flat zone 204 has a radial length in the range of 7.62 to 76.2 mm (approximately 0.3 to 3.0 inches). In some examples, the flat zone 204 extends radially outwardly into or partway through a radially outer zone 410. In some examples, the flat zone 204 extends into a radially outer zone 410 that lies between a radial midpoint of the fBSR 202 and a circumference 413 of the fBSR 202. In some examples, the flat zone 404 extends radially outwardly to the full circumference 413 of the fBSR 402. In some examples, the flat zone 204 terminates at step 408. In some examples, the fBSR 202 includes one or more locating recesses or formations 414 and 415 for centering the fBSR 202 on over a wafer or on a substrate-support assembly, such as a chuck 102 (FIG. 1). The fBSR 202 may include certain geometric features, such as an internally directed inclined face or slope 416, or an externally directed inclined face or slope 418. Some examples of an fBSR 202 may include other or further geometric features to enhance the functionality of the fBSR 202.

Figure 4B:
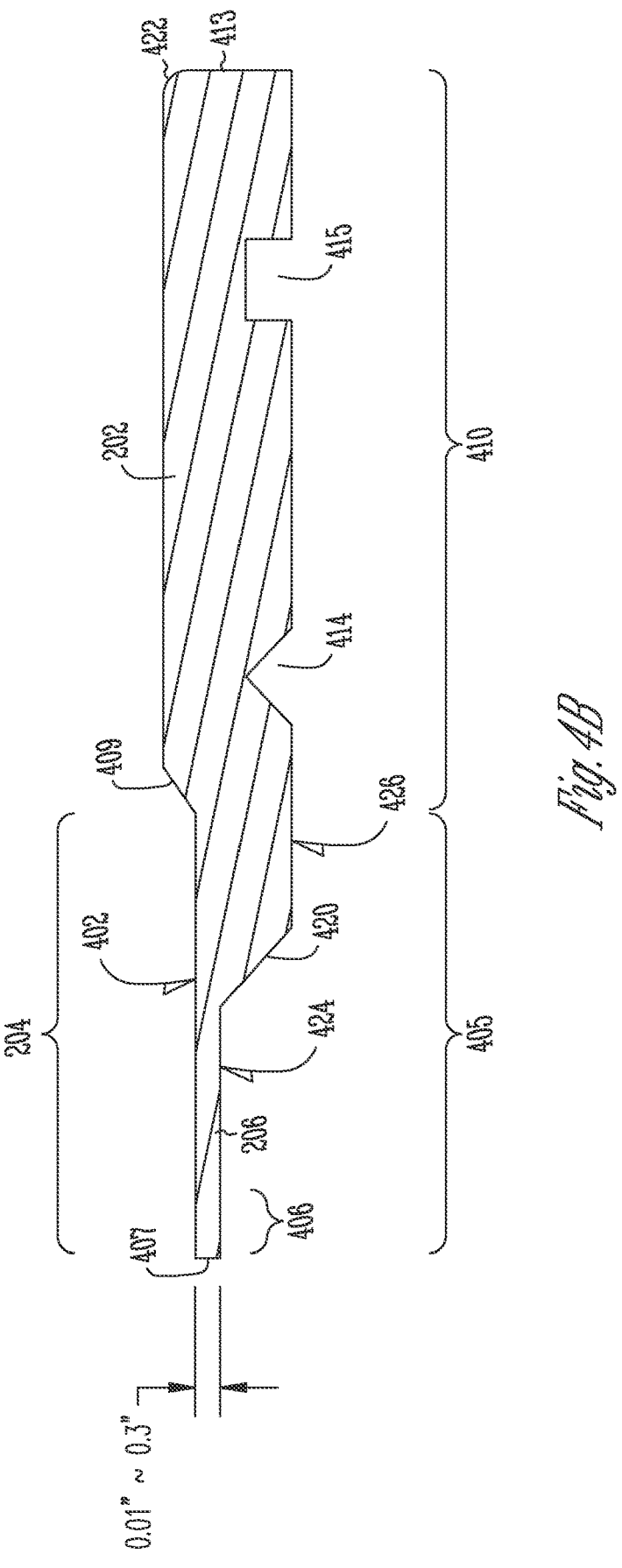
FIG. 4B illustrates an fBSR in accordance with another example embodiment of the present disclosure.

In this regard, FIG. 4B illustrates an fBSR 202 according to further example embodiments of the present disclosure. In some examples, the flat zone 204 terminates at the foot of an inclined face or slope 409. Other termination configurations are possible, such as a smooth curve or other formation. In some examples, a geometric feature includes an expanded internally directed inclined face or slope 420 extending between an underside 424 of the thin overhang 206 and an underside 426 of the fBSR 202. In some examples, an inclined face or slope is provided at other or further locations such as an intersection of two planes or surfaces of the fBSR 202. In some examples, a geometric feature may include a contoured formation, such as the rounded corner 422. A contoured formation may be provided at an intersection of two planes or surfaces of the fBSR 202, for example.

In some examples, the locating formations 414 and 415 have different sectional profiles or shapes. Other examples are possible. The locating formations 414 and 415 may have the same shape, or different shapes to those shown. An example fBSR 202 may include only one locating formation 414 or 415, or a plurality of locating formations including both of the locating formations 414 and 415, for example. Further locating formations, and configurations thereof, are possible. For example, a spacing between the locating formations 414 and 415 may vary. In some examples, a locating formation 414 or 415 is configured to engage with a specific element on a substrate-support assembly, for example, the confinement ring 220 (FIG. 2).

Figure 5:
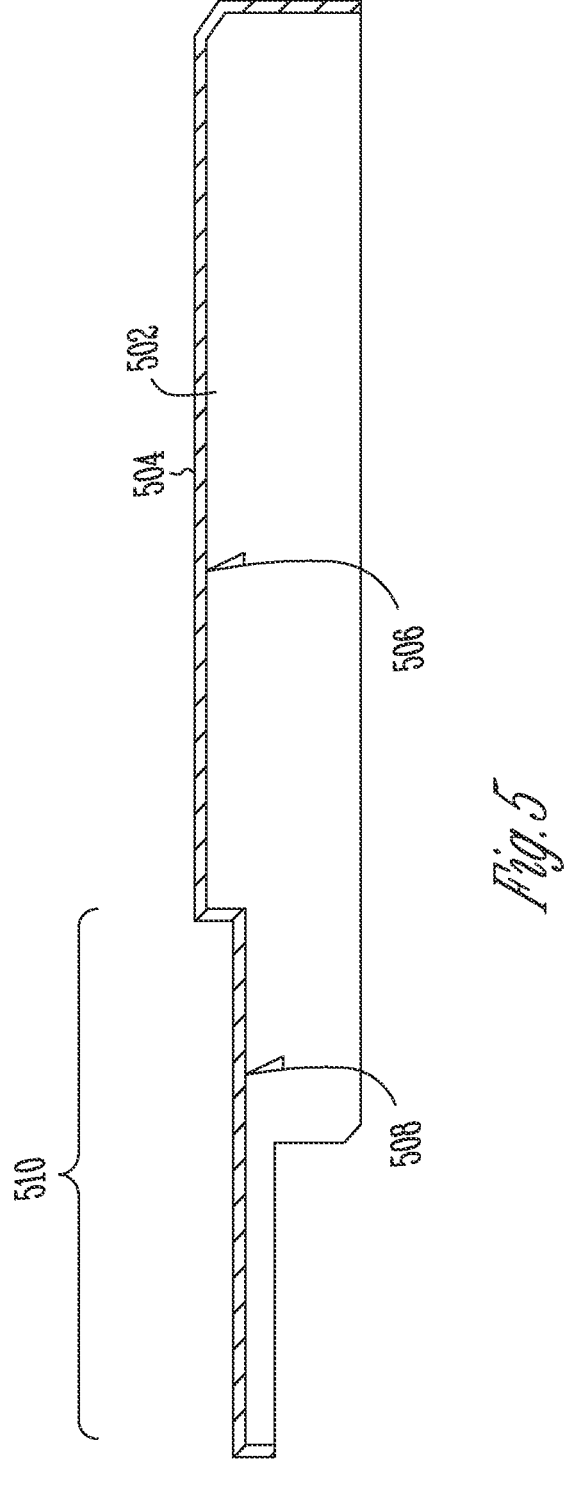
FIG. 5 illustrates an fBSR in accordance with another example embodiment of the present disclosure.

FIG. 5 illustrates a coated fBSR according to some embodiments of the present disclosure. With reference to FIG. 5, an fBSR 502 is treated with a coating 504 to enhance a material strength or chemical resistance of the fBSR 502. The coating 504 may include an oxide coating, for example, an yttrium oxide coating. The coating 504 may extend over entire upper surfaces 506 and 508 of the fBSR 502, for example. In some examples, the coating 504 covers only an upper surface 508 corresponding to the flat zone 510, or the upper surface 506. Other combinations of coating types and zones of coverage are possible.

Figures 6A, 6B:
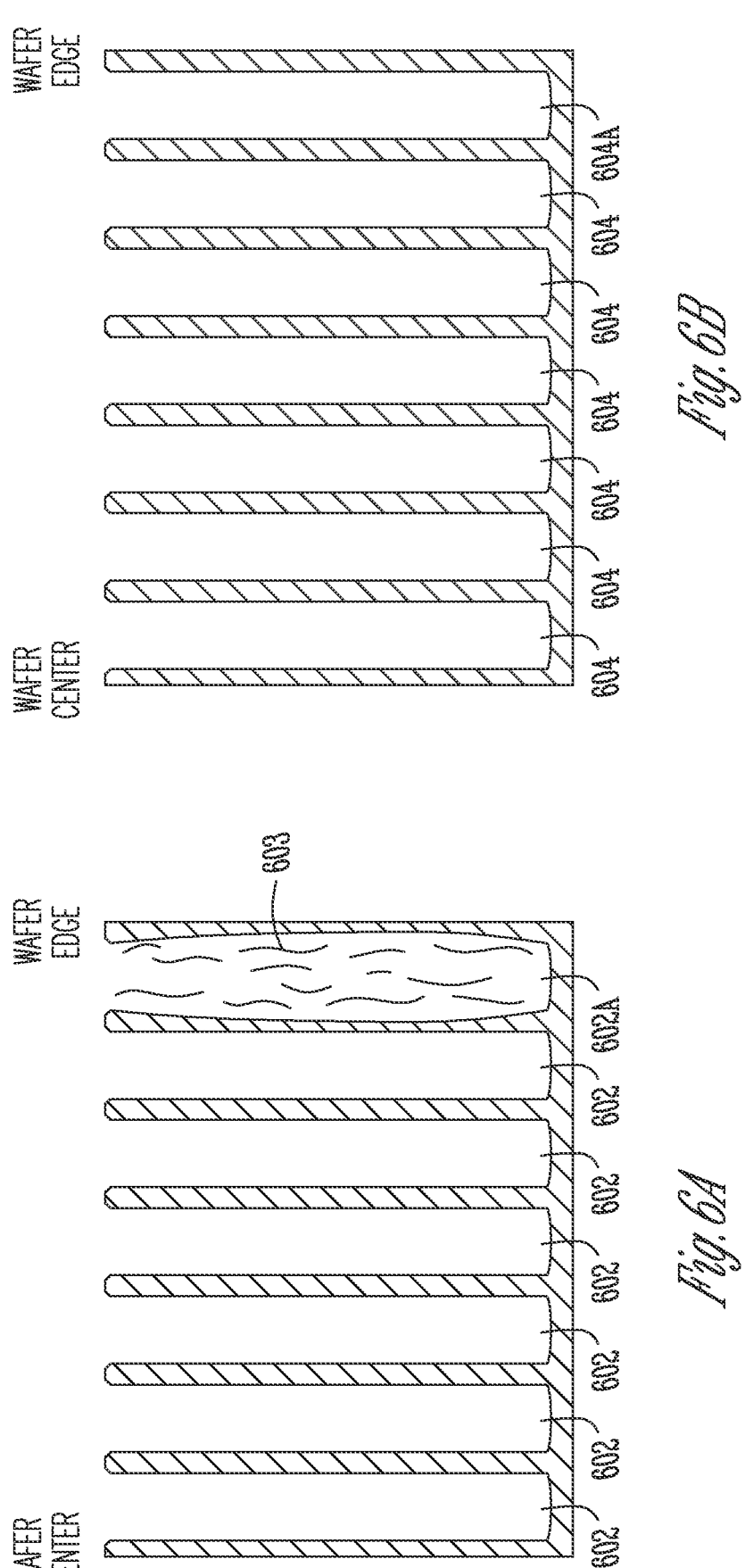
FIGS. 6A-6B are diagrams illustrating comparative examples of substrate formations, according to some embodiments.

FIG. 6A is a diagram illustrating example formations 602 created on a wafer surface using a known BSR such as BSR 302. FIG. 6A shows that the profile 602A at the edge of the wafer is deformed and includes striations 603. This type of deformation, in some instances, indicates that an etch stop is about to be reached. By contrast, FIG. 6B illustrates consistent example formations 604 created on a wafer surface using an fBSR of the present disclosure. In comparison with FIG. 6A, FIG. 6B shows a much cleaner profile along the edge of the wafer (604A) with no striations. This indicates that a higher aspect ratio can still be achieved.

Figure 7:
FIG. 7 is a flow chart showing a method for using an fBSR in accordance with an example embodiment of the present disclosure.
Figure 7:
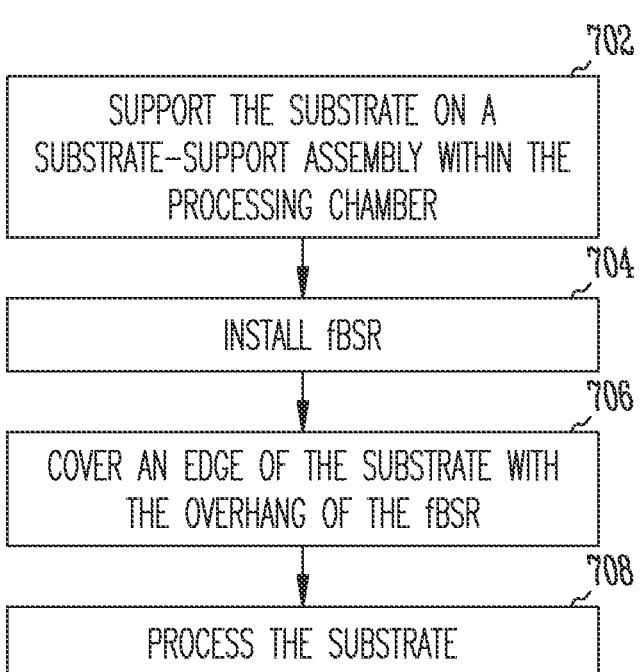

FIG. 7 illustrates a process 700 for using an fBSR in a processing chamber for processing a substrate (such as a wafer) according to certain embodiments.

In operation 702, the process 700 starts with supporting the substrate on a substrate-support assembly within the processing chamber. The process 700 then proceeds to operation 704.

In operation 704, the process 700 includes installing the fBSR in the processing chamber and centering it over the substrate. The centering operation may include engaging a centering formation on the fBSR with the substrate-support assembly. The fBSR may comprise an overhang for covering an edge of the substrate in the processing chamber, the flat zone extending radially outward over the outer edge of the substrate. The process 700 then proceeds to operation 706.

In operation 706, the process 700 includes covering an edge of the substrate with the overhang of the fBSR. The process 700 then proceeds to operation 708.

In operation 708, the process 700 includes processing the substrate.

To further illustrate the apparatus and methods disclosed herein, a non-limiting list of examples is provided here:

1. A flat Bottom Shadow Ring (fBSR) for processing a substrate in a processing chamber, the fBSR comprising: an overhang for covering an edge of the substrate in the processing chamber, a flat zone extending radially outward over an outer edge of the substrate.

2. The fBSR of example 1, wherein the flat zone is generally parallel with an upper surface of the substrate.

3. The fBSR of example 1 or example 2, wherein a radial length of the flat zone is in a range of about 7.62 to 76.2 mm (approximately 0.3 to 3.00 inches).

4. The fBSR of any one of examples 1-3, wherein the flat zone extends radially outwardly into a radially outer zone of the fBSR, the radially outer zone lying between a radial midpoint of the fBSR and a circumference of the fBSR.

5. The fBSR of any one of examples 1-4, wherein the flat zone extends radially outward to the circumference of the fBSR.

6. The fBSR of any one of examples 1-5, wherein the flat zone includes a coating.

7. The fBSR of example 6, wherein the coating includes an oxide coating.

8. A method of processing a substrate in a processing chamber, the method comprising: supporting the substrate on a substrate-support assembly within the processing chamber; installing a flat Bottom Shadow Ring (fBSR) in the processing chamber, wherein the fBSR comprises an overhang for covering an edge of the substrate in the processing chamber, and wherein the overhang includes a flat zone extending radially outward over an outer edge of the substrate; centering the fBSR over the substrate and covering the edge of the substrate with the overhang of the fBSR; and processing the substrate in the processing chamber. In some examples, the fBSR used in the example method includes any one or more of the features defined in examples 1-7.

Although examples have been described with reference to specific example embodiments or methods, it will be evident that various modifications and changes may be made to these embodiments without departing from the broader scope of the embodiments. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom. This detailed description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is disclosed. Thus, although specific embodiments have been illustrated and described herein, it should be appreciated that other arrangements calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. A flat Bottom Shadow Ring (fBSR) for processing a substrate in a processing chamber, the fBSR comprising:
   an overhang for covering an edge of the substrate in the processing chamber; and
   a flat zone extending radially outward over an outer edge of the substrate, the flat zone forming a plane that is generally parallel with an upper surface of the fBSR, wherein a radial length of the flat zone is in a range of about 7.62 to 76.2 mm (approximately 0.3 to 3.00 inches).

2. The fBSR of claim 1, wherein the flat zone is generally parallel with an upper surface of the substrate.

3. The fBSR of claim 1, wherein the flat zone extends radially outwardly into a radially outer zone of the fBSR, the radially outer zone lying between a radial midpoint of the fBSR and a circumference of the fBSR.

4. The fBSR of claim 3, wherein the flat zone extends radially outward to the circumference of the fBSR.

5. The fBSR of claim 1, wherein the flat zone includes a coating.

6. The fBSR of claim 5, wherein the coating includes an oxide coating.

* * * * *